(12) United States Patent
White et al.

(10) Patent No.: US 7,438,175 B2
(45) Date of Patent: Oct. 21, 2008

(54) LINEAR VACUUM DEPOSITION SYSTEM

(75) Inventors: John M. White, Hayward, CA (US);
Wendell T. Blonigan, Pleasanton, CA (US)

(73) Assignee: Applied Materials, Inc., Santa Clara, CA (US)

(*) Notice: Subject to any disclaimer, the term of this patent is extended or adjusted under 35 U.S.C. 154(b) by 397 days.

(21) Appl. No.: 11/176,085

(22) Filed: Jul. 7, 2005

(65) Prior Publication Data
US 2006/0278497 A1  Dec. 14, 2006

Related U.S. Application Data

(60) Provisional application No. 60/689,621, filed on Jun. 10, 2005.

(51) Int. Cl.
*B65G 43/08* (2006.01)
(52) U.S. Cl. ............... 198/346.2; 414/217; 118/719
(58) Field of Classification Search .......... 414/217, 414/219; 198/346.2, 346.3; 118/715, 718, 118/719
See application file for complete search history.

(56) References Cited

U.S. PATENT DOCUMENTS

| | | | |
|---|---|---|---|
| 4,483,651 A | 11/1984 | Nakane et al. | |
| 4,500,407 A * | 2/1985 | Boys et al. | 198/346.2 |
| 5,425,611 A | 6/1995 | Hughes et al. | |
| 6,176,668 B1 | 1/2001 | Kurita et al. | 414/217 |
| 6,206,176 B1 | 3/2001 | Blonigan et al. | 198/619 |
| 6,213,704 B1 | 4/2001 | White et al. | 414/217 |
| 6,235,634 B1 | 5/2001 | White et al. | |
| 6,286,230 B1 | 9/2001 | White et al. | |
| 6,298,685 B1 | 10/2001 | Tepman | 62/378 |
| 6,471,459 B2 | 10/2002 | Blonigan et al. | 414/217 |
| 6,485,248 B1 * | 11/2002 | Taylor, Jr. | 414/217 |
| 6,517,303 B1 | 2/2003 | White et al. | 414/217 |
| 6,634,845 B1 * | 10/2003 | Komino | 414/217 |
| 6,679,671 B2 | 1/2004 | Blonigan et al. | 414/217 |
| 6,808,592 B1 | 10/2004 | Rigali et al. | |
| 6,919,001 B2 * | 7/2005 | Fairbairn et al. | 118/719 |
| 6,971,832 B2 | 12/2005 | Ackeret et al. | |

OTHER PUBLICATIONS

PCT Notification of Transmittal of the International Search Report and Written Opinion for PCT/US06/09090 dated Oct. 20, 2006. (APPM/010229 PCT).

* cited by examiner

*Primary Examiner*—James R Bidwell
(74) *Attorney, Agent, or Firm*—Patterson & Sheridan LLP

(57) ABSTRACT

Embodiments of a vacuum conveyor system are provided herein. In one embodiment a vacuum conveyor system includes a first vacuum sleeve having a plurality of rollers that support and move substrates through the first vacuum sleeve. A port is provided for sealably coupling the first vacuum sleeve to a process chamber. A first substrate handler is disposed proximate the port. Multiple ports may be provided for sealably coupling the first vacuum sleeve to a plurality of process chambers. A dedicated substrate handler is provided for each process chamber. A second vacuum sleeve may be sealably coupled to an opposing side of the process chambers. The vacuum conveyor system may be modular with independent modules linked via load lock chambers. The plurality of rollers may compensate for any sag of the leading edge of a substrate being transported thereupon.

7 Claims, 9 Drawing Sheets

LINEAR VACUUM DEPOSITION SYSTEM

CROSS-REFERENCE TO RELATED APPLICATION

This application claims benefit of United States Provisional Application Ser. No. 60/689,621, entitled "Linear Vacuum Deposition System", filed Jun. 10, 2005, which is hereby incorporated by reference in its entirety. This application is additionally related to U.S. application Ser. No. 11/176,742, entitled "Substrate Handling System", filed Jul. 7. 2005, and U.S. application Ser. No. 11/176,861, entitled "Substrate Conveyor System", filed Jul. 7, 2005, and issued as U.S. Pat. No. 7,296,673, each of which is hereby incorporated by reference in its entirety.

BACKGROUND OF THE INVENTION

1. Field of the Invention

Embodiments of the present invention generally relate to a vacuum deposition system. More specifically, the present invention relates to a vacuum conveyor system for transporting substrates within a vacuum environment.

2. Description of the Related Art

Glass substrates are being used to fabricate active matrix television and computer displays, or for solar panel applications, among others. In a television or computer display application, each glass substrate can form multiple display monitors each of which contains more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions in the range of, for example, about 370 mm by 470 mm up to about 1870 mm by 2200 mm. Moreover, the trend is toward even larger substrate sizes to allow more displays to be formed on the substrate or to allow larger displays to be produced. The larger sizes place even greater demands on the capabilities of the processing systems, which are growing in size and capability as well to handle the larger substrates.

However, the current production equipment is getting more costly. For example, cluster tools suitable for vacuum processing of large glass substrates, e.g., 1 m$^2$ and larger, require a relatively large floor space and are very costly. As such, the incremental cost of adding additional equipment to the production line to increase throughput is very expensive.

Therefore, there is a need for an improved system for processing substrates.

SUMMARY OF THE INVENTION

Embodiments of a vacuum conveyor system are provided herein. In one embodiment a vacuum conveyor system includes a first vacuum sleeve and a plurality of rollers that support and move substrates through the first vacuum sleeve. The first vacuum sleeve has a port for sealably coupling the first vacuum sleeve to a process chamber. A first substrate handler is disposed proximate the connector port. Multiple ports may be provided for sealably coupling the first vacuum sleeve to a plurality of process chambers. A dedicated substrate handler is provided for each process chamber. A second vacuum sleeve may be sealably coupled to an opposing side of the process chambers. The vacuum conveyor system may be modular with independent modules linked via load lock chambers. The plurality of rollers may compensate for any sag of the leading edge of a substrate being transported thereupon.

In another embodiment, a vacuum conveyor system includes a first vacuum sleeve enclosing a plurality of rollers that support and move substrates through the first vacuum sleeve. The first vacuum sleeve has a plurality of ports for sealably coupling the first vacuum sleeve to a first side of a plurality of process chambers and a substrate handler disposed proximate each port. A second vacuum sleeve is disposed parallel to the first vacuum sleeve and encloses a plurality of rollers that support and move substrates through the second vacuum sleeve. The second vacuum sleeve has a plurality of ports for sealably coupling the second vacuum sleeve to an opposing second side of the plurality of process chambers and a substrate handler disposed proximate each port.

In another embodiment, a vacuum processing system includes a first vacuum conveyor module and a second vacuum conveyor module. The first vacuum conveyor module includes a first and a second vacuum sleeve, the first and second vacuum sleeves enclosing a plurality of rollers that support and move substrates through the first and second vacuum sleeves. The first and second vacuum sleeves have a plurality of ports for sealably coupling the first and second vacuum sleeves to a first side and an opposing second side, respectively, of each of a plurality of process chambers. The first and second vacuum sleeves have a substrate handler disposed proximate each port. A connector sleeve couples a first end of the first vacuum sleeve to a first end of the second vacuum sleeve and has a plurality of rollers that support and move substrates through the connector sleeve. A load lock couples the first vacuum conveyor module to the second vacuum conveyor module.

In another aspect of the invention, a method for processing substrates is provided. In one embodiment, a method of processing substrates includes providing a vacuum conveyor system having a first vacuum sleeve having a port for sealably coupling the first vacuum sleeve to a process chamber, a plurality of rollers that support and move substrates through the first vacuum sleeve, and a first substrate handler disposed within the first vacuum sleeve proximate the port; conveying a first substrate through the first vacuum sleeve to a position above the first substrate handler; and vertically actuating the first substrate handler to lift the first substrate from the plurality of rollers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of a vacuum conveyor system are provided herein. The vacuum conveyor system is a sealed, sub-atmospheric pressure substrate transport system that may be coupled to a plurality of process chambers to facilitate transfer of substrates between process chambers while remaining at processing pressures, i.e., in a vacuum. The vacuum conveyor system may be connected to any load locks or process chambers, including conventional load locks and process chambers. The process chambers may be any process chambers that operate at a vacuum, such as chemical vapor deposition (CVD) chambers, physical vapor deposition (PVD) chambers, atomic layer deposition (ALD) chambers, or any other deposition or other processing chamber that operates at sub-atmospheric pressures.

Figure 1A:
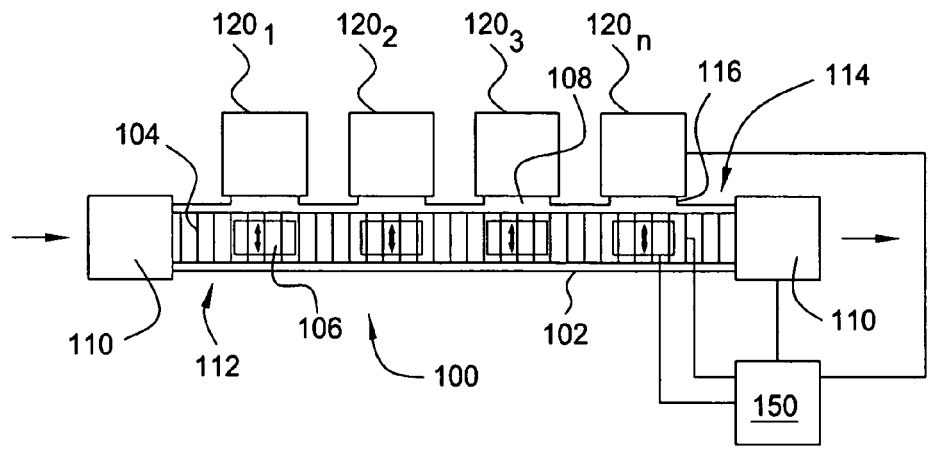
FIG. 1A is a top view of one embodiment of a vacuum conveyor system.

FIG. 1A depicts a simplified top view of a vacuum conveyor system 100. The vacuum conveyor system 100 comprises a vacuum sleeve 102 having one or more ports 108 and enclosing a plurality of rollers 104 and one or more substrate handlers 106. The size of the vacuum sleeve 102 is minimized to provide the smallest possible volume necessary to allow substrate transport therethrough. The small volume facilitates more easily establishing and maintaining a vacuum within the vacuum sleeve 102 and reduces the time required to pump the pressure down to the desired level of vacuum. The smaller dimensions of the vacuum sleeve 102 further increase the robustness of the vacuum conveyor system 100 by maintaining a smaller volume of vacuum within the vacuum sleeve 102, thereby lessening the forces resultant from the pressure differential between the low interior pressure and atmospheric pressure outside of the vacuum sleeve 102.

Figure 1B:
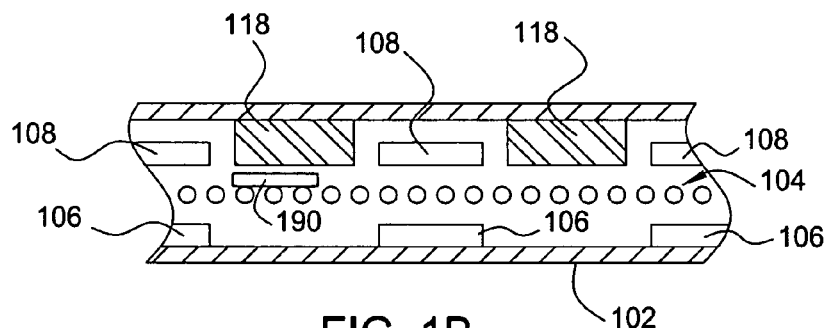
FIG. 1B is a partial side view of a vacuum conveyor system.

Optionally, and as depicted in FIG. 1B, one or more volume reducers 118 may be provided to reduce the interior volume of the vacuum sleeve 102. The volume reducer may be a solid or hollow member, for example a hollow box, that occupies space within, i.e., reduces the interior volume of, the vacuum sleeve 102. In one embodiment, the volume reducers 118 may be disposed above the plurality of rollers 104 and between adjacent ports 108. The volume reducers 118 are sized to not interfere with the transport and handling of a substrate 190 supported on the plurality of rollers 104 or the substrate handlers 106. It is contemplated that volume reducers having any shape or size may be placed in any unobtrusive location within the vacuum sleeve 102 to further reduce the interior volume of the vacuum sleeve 102 that must be evacuated and maintained at a desired vacuum pressure.

Returning to FIG. 1A, determinant factors for the volume of the vacuum sleeve 102 include factors that affect the height, length, and width of the vacuum sleeve 102. For example, the height of the vacuum sleeve 102 is constrained by the height of the plurality of rollers and the height to which the substrate must be raised by the substrate handlers 106. In one embodiment, the height of the vacuum sleeve is less than about 30 inches. In another embodiment, the height of the vacuum sleeve 102 is less than about 20 inches. The length of the vacuum sleeve is constrained by the number of process chambers 120 attached thereto and the spacing between the process chambers. The width of the vacuum sleeve 102 is constrained by the width of the substrate and the extra width required for the lateral movement of the substrate by the substrate handlers 106.

The vacuum sleeve 102 has one or more ports 108 for sealably coupling the vacuum sleeve 102 to one or more process chambers. The process chambers may be sealably coupled to the vacuum sleeve 102 in any suitable manner and the process chambers may be mounted flush with the vacuum sleeve 102. In the embodiment depicted in FIG. 1A, four process chambers $120_1$, $120_2$, $120_3$ and $120_n$ are shown connected to the vacuum sleeve 102 of the vacuum conveyor system 100 at respective ports 108. The ports 108 couple the vacuum sleeve 102 to the process chambers around a corresponding aperture, e.g., a process chamber slit valve, to facilitate transferring a substrate between the vacuum sleeve 102 and the process chambers $120_1$-$120_n$. Coupling the process chambers close to the vacuum sleeve 102 minimizes the horizontal distance that a substrate must move to be transferred by the substrate handlers 106 from the plurality of rollers 104 to the substrate support of the respective process chamber, thereby helping to minimize the volume of the vacuum sleeve 102.

Optionally, a connector 116 may be disposed between the vacuum sleeve 102 and one or more of the process chambers. The connector 116 may be an adapter that facilitates mating the vacuum sleeve 102 with process chambers that are unable to be directly coupled to the vacuum sleeve 102. Alternatively or in combination, the connector 116 may be a spacer for positioning a process chamber in a desired location. For example, the connector 116 may be utilized to more accurately locate a substrate support disposed within a process chamber at a desired distance from the vacuum sleeve 102 to facilitate alignment with the extended position of a respective substrate handler 106.

The one or more substrate handlers 106 are dedicated to a particular process chamber and, as such, one substrate handler 106 is provided proximate each process chamber coupled to the vacuum sleeve, for example, process chambers $120_{1-n}$ coupled to the vacuum sleeve 102 in FIG. 1A. The substrate handlers 106 generally have an idle position that does not interfere with the substrates traveling on the plurality of rollers 104 through the vacuum sleeve 102, and at least a transfer position suitable for transferring substrates to and from the process chamber. As such, the substrate handlers 106 only need to have a range of vertical motion and a range of horizontal motion in a direction towards and away from the process chambers, i.e., perpendicular to the length of the vacuum sleeve 102, thereby being substantially less expensive than vacuum transfer robots having additional lateral and/or rotational degrees of freedom. It is contemplated that the position of the substrate handler 106 may controllably fixed at multiple locations within the vertical and horizontal ranges of motion.

Suitable sensors and control systems (not shown) for the substrate handlers 106 may be provided and integrated with a controller 150 that controls the operation of the vacuum conveyor system 100. The sensors and control systems may detect the position of a substrate on the plurality of rollers 104 and/or on the substrate handlers 106. The sensors and control systems may further detect the position of the substrate handlers 106—and/or and substrate supported thereon—when the substrate handlers 106 are utilized to transfer a substrate into or from a respective process chamber.

Figure 3A:
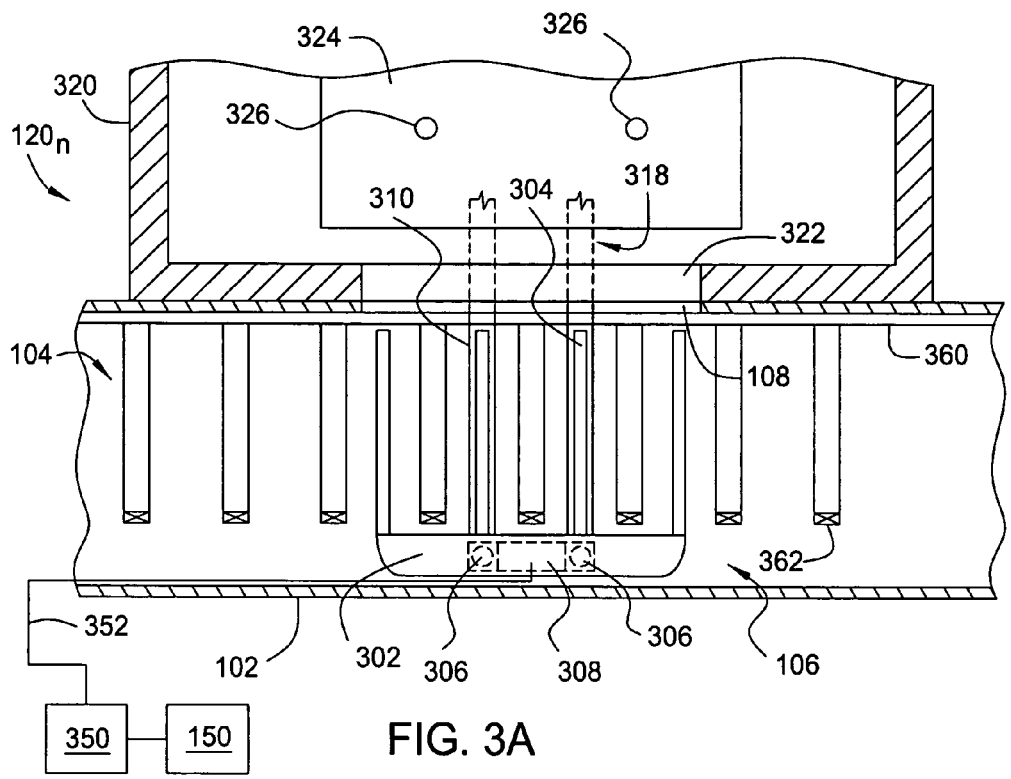
FIGS. 3A-B are partial top and side views, respectively, of a vacuum conveyor system detailing one embodiment of a substrate handler.
Figure 3B:
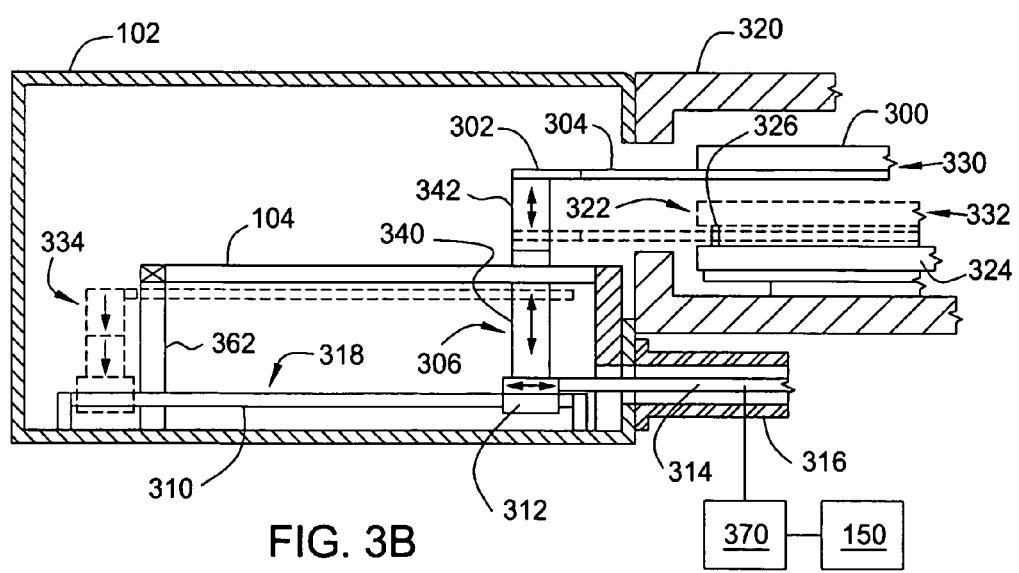

FIGS. 3A and 3B respectively depict top and side views of one embodiment of the substrate handler 106. The substrate handler 106 generally includes a substantially flat surface for supporting a substrate thereupon and is configured to travel between the plurality of rollers 104. In one embodiment, the substrate handler 106 includes a bracket 302 with a plurality of support fingers 304 extending horizontally therefrom. The support fingers 304 are positioned between individual ones of the plurality of rollers 104, and in retracted position, lie below the height of the plurality of rollers 104, so as not to interfere with the motion of the substrate thereover.

The support fingers 304 of the substrate handler 106 are vertically positioned by one or more vertical motion assemblies 306 coupled to the bracket 302. The vertical motion assemblies 306 may provide a range of motion that is infinitely controllable or controllable to discrete positions. In one embodiment, a pair of vertical motion assemblies 306 each comprise a pair of vertically stacked actuators 340, 342 that each have an extended and a retracted position. Control of the actuators 340, 342 allow for a retracted position 334 (both actuators retracted), a transfer position 332 (one actuator extended, the other retracted), and a raised position 330 (both actuators extended). The amount of extension needed will be dependent upon the distance between the retracted position, the height of the bottom of a substrate 300 extended upon a set of lift pins 326 in a process chamber $120_n$, and the height of the top of a slit valve 322 formed in a wall 320 of the process chamber $120_n$.

The vertical motion assemblies 306 may include any suitable actuator, such as a pneumatic or hydraulic actuator, screw, solenoid, motor, or any suitable actuator for providing the desired vertical motion of the substrate handler 106. In one embodiment, the actuators 340, 342 of the vertical motion assemblies 306 are sealed pneumatic actuators. A flexible tube (not shown) may be run to an air source (not shown) disposed outside of the vacuum sleeve 102.

A controller 308 is provided to control the vertical actuation of the substrate handler 106. AC power from an AC power source 350 is provided through power line 352 to the controller 308. Control signals may be provided through the AC power line by modulating the control signals at varying frequencies. Thus, multiple substrate handlers 106 may be independently controlled while being connected to the same power line 352 and AC power source 350. The control signals may be provided by a controller 150 (described below with respect to FIG. 1A).

A horizontal motion assembly 318 provides for horizontal movement of the substrate handler 106, e.g., the movement into and out of the process chambers. The horizontal motion assembly 318 may include any suitable mechanism such as pneumatic or hydraulic actuators, lead screws, motors, and the like. In one embodiment, the horizontal motion assembly 318 includes a stage 312 movably coupled to a plurality of horizontal rails 310. The stage 312 is coupled to the bottom of the vertical motion assemblies 306 such that movement of the stage 312 moves the bracket 302 and support fingers 304. The horizontal rails 310 are disposed on a bottom of the vacuum sleeve 102 substantially parallel to the plurality of rollers 104 to facilitate horizontal movement towards and away from the process chamber.

An extension 314 is coupled to the stage 312 and projects through an opening formed in the vacuum sleeve 102. A tube 316 is coupled to the vacuum sleeve 102 around the opening to maintain vacuum integrity. An o-ring or other sealing mechanism (not shown) may optionally be disposed between the tube 316 and the vacuum sleeve 102 to facilitate forming an air-tight seal. The tube 316 provides a sealed area long enough to allow the extension 314 to move as required to control the horizontal position of the substrate handler 106. The tube 316 provides a sealed area long enough to allow the extension 314 to move as required to control the horizontal position of the substrate handler 106.

A drive mechanism 370 is coupled to the extension 314 through the tube 316 to control the horizontal movement of the substrate handler 106. The drive mechanism 370 may further be controlled by the controller 150. In one embodiment, the drive mechanism 370 may be a magnetic drive system. One example of a magnetic drive system suitable for use with the present invention is described in U.S. Pat. No. 6,471,459 issued Oct. 29, 2002 to Blonigan, et al., and entitled, "Substrate Transfer Shuttle Having a Magnetic Drive," which is hereby incorporated by reference.

Figure 5A:
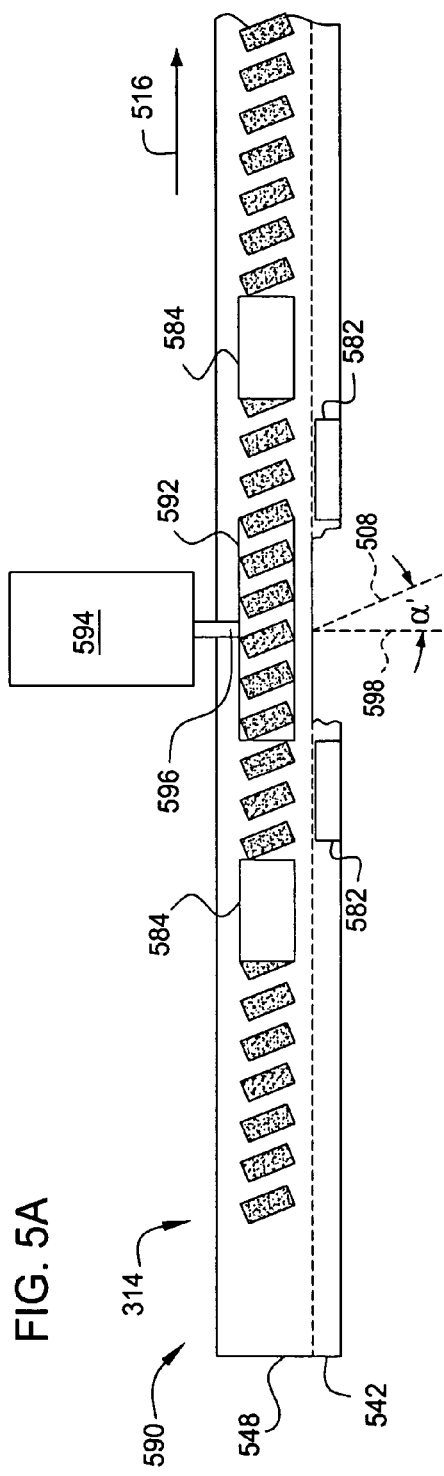
FIGS. 5A-B are schematic top and side views, respectively, of one embodiment of a magnetic rack and pinion drive mechanism suitable for use with embodiments of the substrate handler.
Figure 5B:
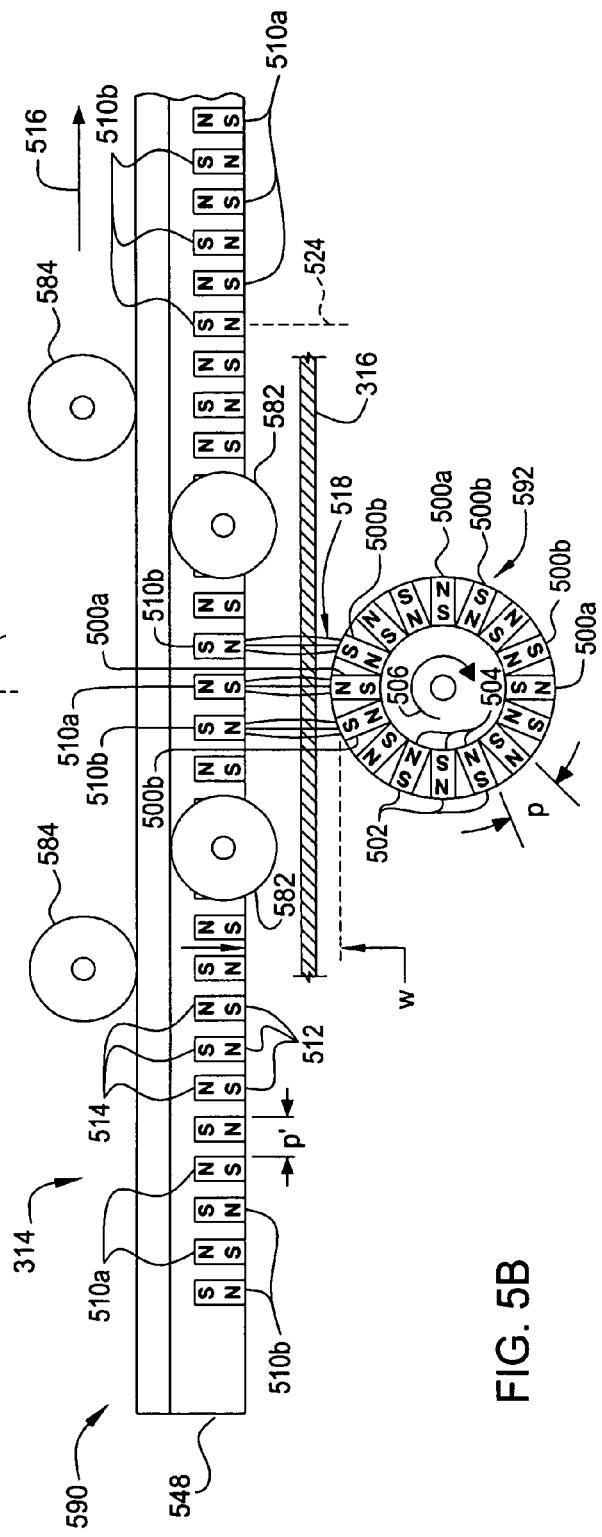
Figure 5C:
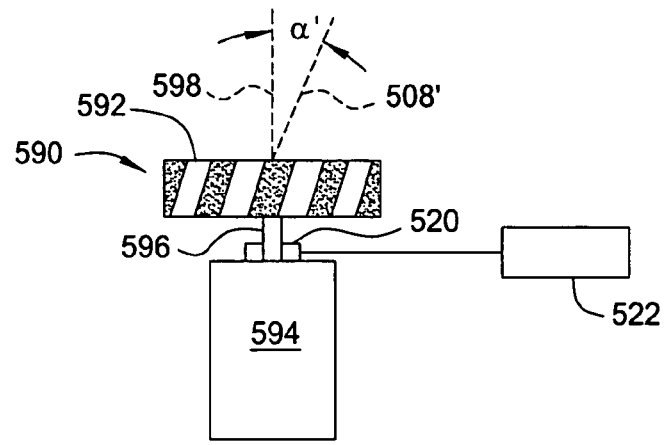
FIG. 5C is a bottom view of the magnetic pinion of the magnetic rack and pinion drive mechanism of FIGS. 5A-B.

FIGS. 5A-B are schematic top and side views, respectively, of one embodiment of a magnetic rack and pinion drive mechanism suitable for use with embodiments of the substrate handler. FIG. 5C is a bottom view of the magnetic pinion of the magnetic rack and pinion drive mechanism of FIGS. 5A-B. Referring simultaneously to FIGS. 5A-C (certain elements of the substrate processing system are not illustrated in FIGS. 5A-5C for the sake of clarity), each magnetic drive mechanism, e.g., drive mechanism 590, includes a wheel-shaped magnetic pinion 592 positioned beneath the tube 316 containing the extension 314 of the substrate handler 106. At least a portion of the extension 314 comprises a magnetic rack 548 corresponding to the magnetic pinion 592. A flange 542 may be formed on one or both sides of the rack 548 and one or more rotating supports 582, 584 may be positioned to support the rack 548 and prevent sagging due to gravity or the magnetic coupling to the pinion 592.

The magnetic pinion 592 may be positioned beneath an associated tube 316 so that it is located outside the processing environment but positioned directly beneath one of the magnetic racks 548. The magnetic pinion 592 is thus separated from the magnetic rack 548 by a gap having a width, w, (see FIG. 5B). The portion of the tube 316 disposed between the magnetic rack 548 and the magnetic pinion 592 is formed of a material having a low magnetic permeability, such as aluminum.

Each magnetic pinion 592 may be coupled to a motor 594 by a drive shaft 596. The axis of rotation (shown by dashed line 98) of the drive shaft 596 and the magnetic pinion 592 is generally perpendicular to the longitudinal dimension of the magnetic rack 548, i.e., perpendicular to the direction of travel of the substrate handler 106.

Each magnetic pinion 592 includes a plurality of interleaved pinion magnets 500a and 500b of alternating polarity. Each pinion magnet is aligned so that its magnetic axis passes substantially through the axis of rotation 598 of the magnetic pinion 592. Similarly, each rack 548 includes a plurality of interleaved rack magnets 510a and 510b of alternating polarity. The magnetic axis of each rack magnet is aligned substantially perpendicular to the axis of rotation of the pinion, e.g., along a vertical axis 524 if the axis of rotation is substantially horizontal. The rack magnets 510a and 510b may be recessed so that they are flush with the bottom surface of the rack 548, and the pinion magnets may be recessed so that they are flush with the outer rim of the pinion 592.

Each magnet in the rack 548 and the pinion 592 may be a substantially rectangular plate which is magnetized so that there is a north pole "N" at one face of the plate and a south pole "S" at the opposite face of the plate. For example, pinion magnets 500a are oriented with their north poles at exterior faces 502 of the plates and their south poles at interior faces 504 of the plates. On the other hand, pinion magnets 500b are oriented with their north poles at interior faces 504 of the plate and their south poles at exterior faces 502 of the plates. Similarly, each rack magnet 510a is oriented with a north pole at an upper face 514 of the plate and a south pole at a lower face 512 of the plate. Conversely, each rack magnet 510b is oriented with a north pole at the lower face 512 of the plate and a south pole at the upper face 514 of the plate.

As shown in FIG. 5A, a primary axis of each rack magnet plate (shown by dashed line 508) may be arranged with a so-called "helix" angle $\alpha$ between the axis of rotation 598 and the primary axis 508. As shown in FIG. 5C, the pinion magnet plates may be arranged with the same helix angle $\alpha'$, between the axis of rotation 598 of the pinion 592 and the primary axis 508' of the pinion magnets. The helix angle may be up to about 45 degrees. Alternately, the primary axis of each magnet may be oriented generally parallel to the axis of rotation 98 of the pinion ($\alpha$=0 degrees). Thus, the helix angle may be between about 0 and 45 degrees. By positioning the magnets at a helix angle, the variations in the magnetic attraction forces between the rack and pinion magnets as their magnetic fields engage and disengage are reduced, thereby providing a smoother linear motion of the substrate handler 106. In either case, at the closest point of approach, the pinion magnet will be substantially coplanar with its associated rack magnet.

The pinion magnets 500a and 500b are separated by a pitch P, which is equal to the pitch P' of the rack magnets 510a and 510b. The pitches P and P' may be about ¼ inch. The specific pitch may be selected based on the strength of the magnets, the weight of the substrate handler and any substrate to be supported thereupon, the width W of the gap between the rack and pinion, and the desired speed at which the substrate handler will move between the sleeve 102 and the respective process chamber.

As best shown in FIG. 5B, the rack and pinion magnets engage as their opposing poles lock together (shown by lines of magnetic force 518). If the pinion 592 is rotating, then as each pinion magnet, e.g., pinion magnet 500a, moves toward the rack 548, it will magnetically couple with the closest magnet of opposing polarity, e.g., rack magnet 510a. In addition, the adjacent pinion magnets 500b (of opposite polarity as pinion magnet 500a) will be magnetically coupled to the adjacent rack magnets 510b. Thus, as the pinion 592 rotates, e.g., in the direction shown by arrow 506, the substrate handler 106 will be driven horizontally, i.e., in the direction shown by arrow 516. Conversely, if the pinion 592 rotates in a direction opposite to arrow 506, the substrate handler 106 will be driven in a direction opposite to arrow 516.

The alternating polarity of the magnets prevents magnetic coupling slippage between adjacent magnets in the rack and pinion. Also, since the engagement between the rack and pinion is magnetic, there is a slight give in the coupling, so that the motion of the rack is substantially without jittering or mechanical shock. Furthermore, since there are no rotary feedthroughs or direct physical contact between the rack and pinion, the danger of contamination from the drive mechanism is reduced. Specifically, since the motor and pinion are located outside the processing environment of the chambers (i.e., the sealed environment of the vacuum conveyor system and the attached processing chambers and load lock chambers), the processing chambers and load lock chambers should not be contaminated.

As shown in FIG. 5C, each drive mechanism may include an encoder 520 which provides input to a control system 522, e.g., a general purpose programmable digital computer, to indicate the rotation of the associated drive shaft. The control system 522 may be controlled by, or alternatively may be a part of, the controller 150 depicted in FIG. 1A.

Returning to FIGS. 3A-B, in operation, the substrate handler 106 is initially in the idle position 354, wherein the fingers 304 are disposed below and in between the rollers 104. To remove a substrate that may be in a process chamber $120_n$, the controller raises the vertical motion assemblies 306 to elevate the fingers 304 to the transfer position 332. The horizontal drive system 370 then engages the extension 314 of the horizontal motion assembly 318 to move the stage 312 inward toward the processing chamber $120_n$. The substrate 300 is raised by the lift pins 326 on the substrate support 324 disposed within the process chamber 120n. The fingers 304 of the substrate handler 106 in the transfer position 332 are at a height that allows the fingers 304 to pass between the bottom surface of the substrate 300 and the top surface of substrate support 324. After moving underneath the substrate 300, the substrate handler 106 is further actuated to the raised position 330, which lifts the substrate 300 off the lift pins 326. The substrate handler 106 may now retract with the substrate 300 and, once clear of the process chamber 120n, may lower back to the idle position 334, which will dispose the substrate 300 on the surface of the rollers 104. A substrate may be placed onto the substrate support 324 of the process chamber $120_n$ by reversing the above steps.

It is contemplated that other ranges of motion may be utilized to transfer substrates into and out of the process chambers. For example, where the substrate lift pins 326 are controllable to multiple extended positions, the substrate may be lifted off of or placed onto the substrate handler 106 by raising or lowering the lift pins 326 rather than by changing the elevation of the substrate handler 106. As such, certain embodiments of the substrate handler 106 may have only two vertical positions, and idle position below the plurality of rollers 104 and a transfer position suitable for entering and exiting the process chamber 120n.

Figure 4A:
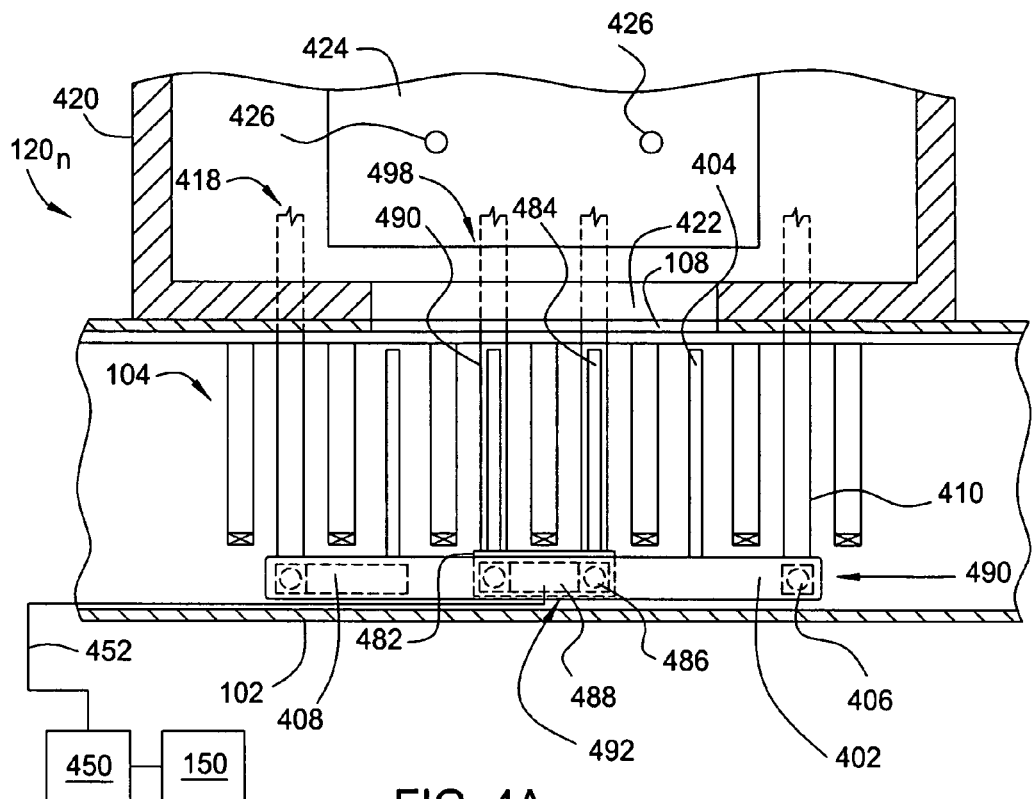
FIGS. 4A-B are partial top and side views, respectively, of a vacuum conveyor system detailing another embodiment of a substrate handler.
Figure 4B:
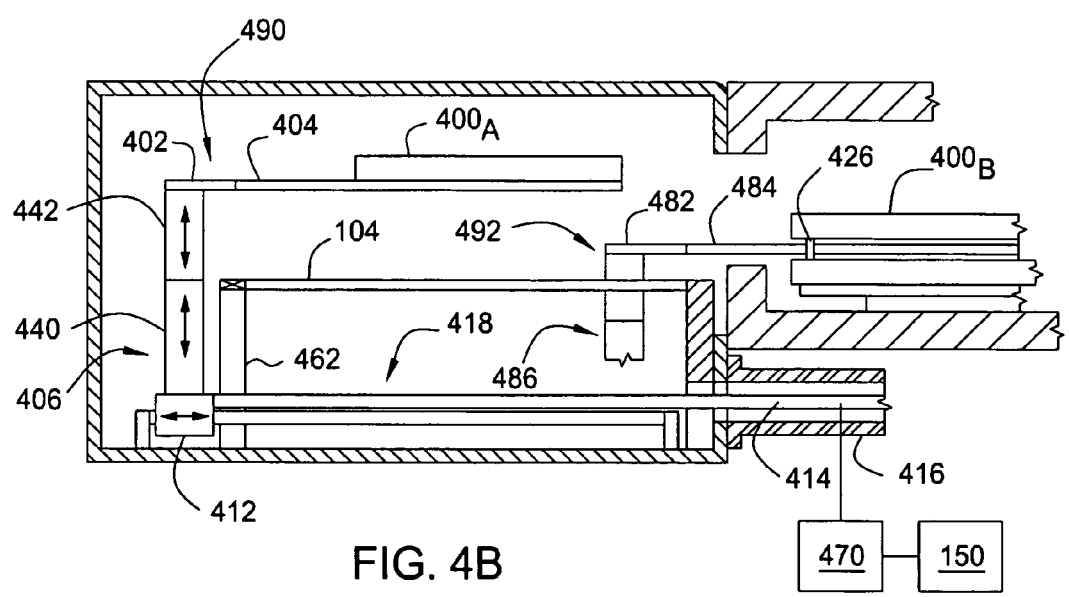

FIGS. 4A and 4B respectively depict top and side views of another embodiment of a substrate handler 106 having a pair of nested fingers that independently operate to move substrates into and out of the process chamber to increase process throughput. The substrate handler 106 described with respect to FIGS. 4A-B is similar to the substrate handler 106 described with respect to FIGS. 3A-B with the exceptions required to allow independent control and movement of the nested fingers. Specifically, the substrate handler described with respect to FIGS. 3A-B and 4A-B may have the same ranges of motion, control mechanisms, and general configuration.

In the embodiment depicted in FIGS. 4A-B, the substrate handler 106 comprises an outer substrate handler 490 and an inner substrate handler 492. The outer an inner substrate handlers 490, 492 are independently controllable and configured to allow the desired ranges of motion of the substrate handlers 490, 492 without collision. The outer and inner substrate handlers 490, 492 are similar except as where noted below.

The outer substrate handler 490 includes an outer bracket 402 having a plurality of outer fingers 404 extending horizontally therefrom. The outer bracket 402 is held in vertical position by a pair of vertical motion assemblies 406. The vertical motion assemblies 406 may optionally be spaced wider than the length of a substrate to facilitate horizontal movement when a substrate is disposed on the plurality of roller 104 between the outer substrate handler 490 and the process chamber $120_n$. The vertical motion assemblies 406 may comprise a pair of stacked vertical actuators 440, 442. The vertical motion assemblies 406 (or vertical actuators 440, 442) are controlled by a controller 408. The controller 408 is coupled to an AC power source 450 by a power line 452 and controls the outer substrate handler 490 as described above with respect to FIGS. 3A-B.

The vertical motion assemblies 406 are coupled to a horizontal motion assembly 418. The horizontal motion assembly 418 includes a stage 412, which is movably coupled to a plurality of horizontal rails 410 that facilitate movement of the outer substrate handler 490 into and out of a slit valve 422, formed in a wall 420 of the process chamber $120_n$. An extension 414 is coupled to the stage 412 and extends through an opening in the vacuum sleeve 102 horizontally in a direction toward and underneath the process chamber $120_n$. A tube 416 is provided to maintain the vacuum integrity of the vacuum sleeve 102. A horizontal drive system 470 is coupled to the extension 414 for providing horizontal movement of the outer substrate handler 490. The horizontal drive system 470 may be the same as described with respect to FIGS. 3A-B and 5A-C.

The inner substrate handler 492 includes an inner bracket 482 having inner fingers 484 extending horizontally therefrom. The bracket 482 is held in position by a pair of vertical motion assemblies 486. The vertical motion assemblies 486 may comprise a pair of stacked vertical actuators (not shown for clarity). The vertical motion assemblies 486 (or stacked vertical actuators) are controlled by a controller 488. The controller 488 is coupled to the AC power source 450 through the power line 452. Alternatively, the controller 408 may independently control both of the inner and outer substrate handlers 490, 492. Thus independent control of the outer substrate handler 490 and the inner substrate handler 492 may be provided utilizing the same power line and power source. The bracket 482 and the fingers 484 of the inner substrate handler 492 may be disposed beneath the bracket 402 and the fingers 404 of the outer substrate handler 490 to conserve space and minimize the width of the vacuum sleeve 102 required to house the substrate handlers 490, 492.

Although not shown for clarity, the horizontal movement of the inner substrate handler 492 on a horizontal motion assembly 498 having a plurality of horizontal rails 480 is controlled in the same manner as the outer substrate handler 490. The plurality of horizontal rails 480 that support the inner substrate handler 492 are provided in a position interior of the plurality of horizontal rails 410 that support the outer substrate handler 490 to facilitate independent movement and control of the inner and outer substrate handlers 490, 492.

In operation, substrates may more efficiently be transferred to and from the process chamber $120_n$ by elevating the outer substrate handler 490 to a transfer position to pick up the substrate 400A from within the process chamber $120_n$. As the outer substrate handler 490 is picking up substrate 400A, substrate 400B arrives on the plurality of rollers 104 in front of the process chamber $120_n$. The inner substrate handler 492 then raises the substrate 400B and moves into the process chamber $120_n$. This may be done while the outer substrate handler 490 is simultaneously withdrawing with the substrate 400A just retrieved from the process chamber $120_n$. The inner substrate handler 492 may then lower the substrate 400B onto the lift pins 426 of the process chamber $120_n$ and then retract from the process chamber $120_n$. The inner substrate handler 492 may then be lowered to the idle position below the plurality of rollers 104 to allow the outer substrate handler 490 to lower the substrate 400A onto the plurality of rollers 104 to complete the transfer.

Although described with respect to a vacuum conveyor system, it is contemplated that the substrate handler described in FIGS. 3A-B and the nested substrate handler described in FIGS. 4A-B may be utilized in other systems requiring substrate conveying and transfer.

Returning to FIG. 1A, the plurality of rollers 104 facilitate movement of substrates through the vacuum sleeve 102. In one embodiment, the plurality of rollers 104 are driven to control the position of a substrate disposed thereupon. The plurality of rollers 104 may be driven and controlled by any suitable means and may be "gang" driven (i.e., all driven in concert), driven in independently controllable groups, or independently driven.

Figure 6A:
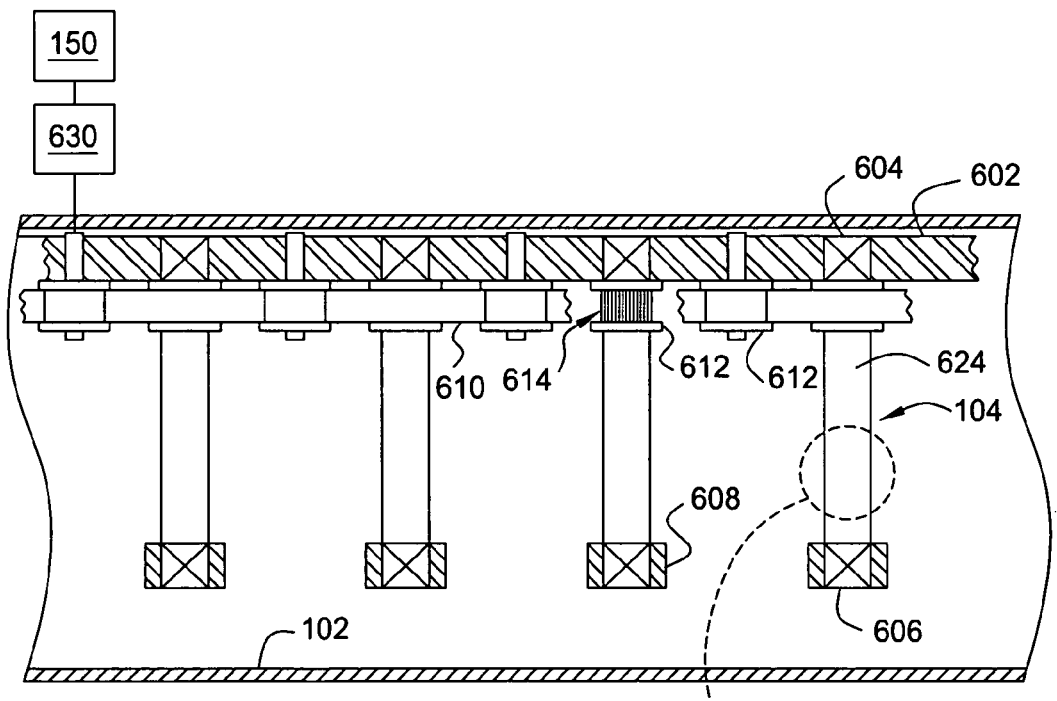
FIG. 6A is a top view of one embodiment of a roller drive system of a vacuum conveyor system.

For example, FIG. 6A depicts one embodiment of the plurality of rollers 104 and a drive system therefor. In one embodiment, the plurality of rollers 104 comprise a plurality of rollers 624 coupled between bearings 604, 606 disposed at either end of the roller 624. The bearing 606 is coupled to a stanchion 608 that rests on the bottom of the vacuum sleeve 102. Bearing 604 is coupled to a drive rail 602 disposed within the vacuum sleeve 102. A pulley 612 is coupled to each of the rollers 624 and interfaces with a belt 610 that controls the motion of the rollers 624. The pulleys 612 may also be provided between the rollers 624 to maintain a proper interface between the pulleys 612 and the belt 610. One or more of the pulleys 612 may further have a feature, such as grooves or notches 614 to interface with features formed on the belt (for example, V notches or square teeth formed on the belt) to improve traction between the pulley 612 and the belt 610, and to prevent slippage therebetween. A motor 630 may be provided to control the motion of the belt 610, and thereby the rollers 624. The motor 630 may be coupled to the controller 150 (shown in FIG. 1A). Each of the rollers 624 may be controlled by a single motor 630. Alternatively, the rollers 624 may be grouped to provide independent control over substrates traveling in specified regions of the conveyor system.

Figure 6B:
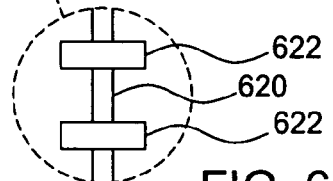
FIG. 6B is a detail of one embodiment of a roller of a vacuum conveyor system.

The rollers 624 may generally comprise a solid or hollow member. Moreover, the width of the rollers 624 may be wide enough to support the substrate thereupon using a single roller 624. Alternatively, the substrate may be supported at multiple points along the width of the substrate. For example, a single roller 624 may be "scalloped" or shaped (not shown) or, as shown in the detail of FIG. 6B, smaller individual rollers 622 disposed on an axis 620 may be utilized to support the substrate at multiple spaced-apart locations, thereby reducing the surface contact area between the plurality of rollers 104 and the substrate. The reduced surface contact area reduces the likelihood of particle generation or damage to the substrate caused by contact between the substrate and the plurality of rollers 104.

The rollers 104 are generally spaced close enough to each other to provide adequate support for the substrates being handled to prevent deformation or damage of the substrate. One problem that may arise from such deformation of the substrate is that a leading edge of the substrate may deflect downward due to gravity and come into contact with the subsequent roller of the vacuum conveyer system 100, thereby potentially causing damage to the substrate and/or the roller. For example, the leading edge of the substrate may become chipped or fractured upon forceful contact with a subsequent roller. In addition, particles generated by the damage to the substrate or by scraping against the subsequent roller may further damage the substrate. This effect may be exacerbated by the high processing temperatures required in certain processes, which may cause the substrate—particularly a glass substrate—to soften and deflect further downwards.

Figure 7A:
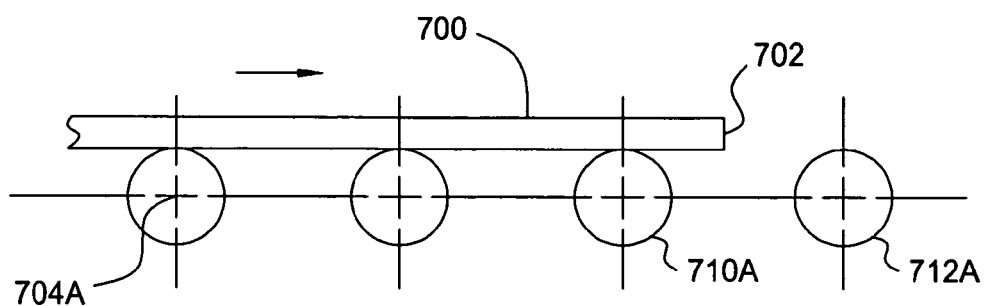
FIGS. 7A-E depict various embodiments of roller configurations.
Figure 7B:
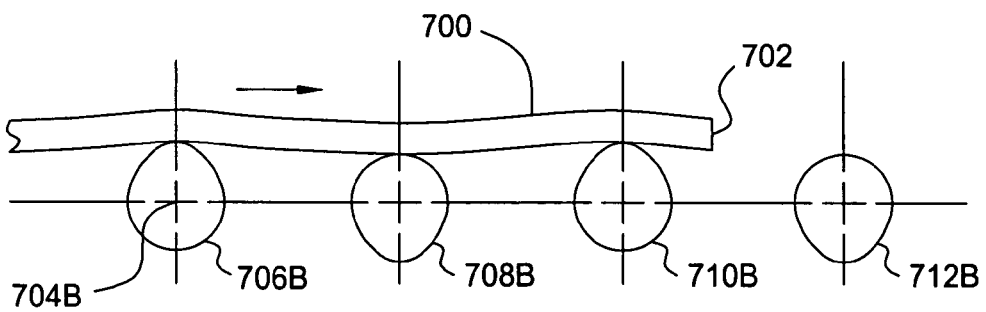
Figure 7C:
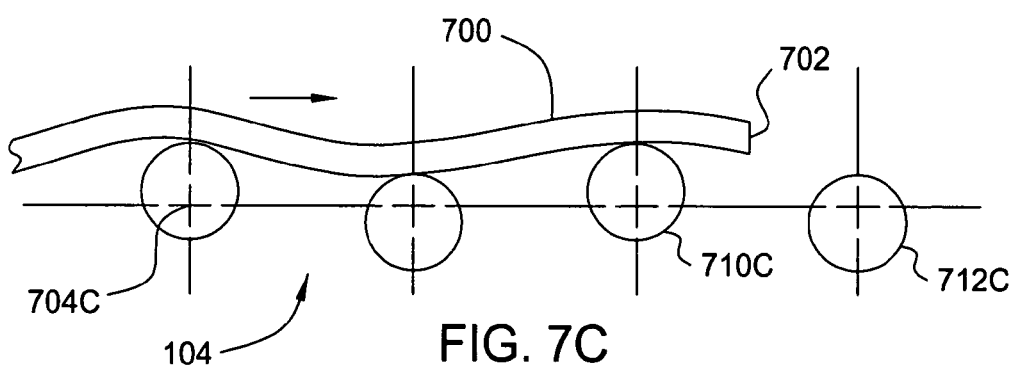

FIGS. 7A through 7C depict embodiments showing various alignments of the plurality of rollers 104. In FIG. 7A, the plurality of rollers 104 are all aligned along a horizontal plane and rotate about an axis 704A, such that the substrate 700 rests flat on the surface of the plurality of rollers 104. As the substrate 700 moves from left to right, as indicated by the arrow, a leading edge 702 of the substrate 700 extends past roller 710A, and becomes unsupported until the leading edge 702 reaches roller 712A as the substrate 700 continues to move forward. For applications where the substrate does not appreciably deflect, the arrangement of the plurality of rollers 104 depicted in FIG. 7A may be sufficient. However, if the leading edge 702 of the substrate 700 deflects downward while unsupported between rollers 710A and 712A, the leading edge 702 may come into contact with roller 712A, potentially damaging the substrate 700.

Alternately, the plurality of rollers may be configured to support the substrate in a manner that compensates for any potential sag in the leading edge of the substrate by supporting the substrate in a manner that positions the leading edge of the substrate above any subsequent rollers as the substrate travels along the plurality of rollers. For example, in one embodiment, the plurality of rollers 104 may be arranged as shown in FIG. 7B, wherein the plurality of rollers 104 comprise eccentric, or cam-shaped rollers. The eccentric rollers support the substrate 700 at a plurality of elevations due to the non-circular profile of the rollers. The eccentric rollers rotate about an axis 706B and may be aligned with respect to one another. Alternatively, the eccentric rollers may be arranged rotationally out of phase with respect to one another such that a plurality of support elevations are provided beneath a given substrate being supported by a subset of the plurality of rollers disposed beneath the substrate.

For example, as depicted in FIG. 7B, the eccentric rollers may be alternatingly arranged 180 degrees out of phase, such that every other roller (e.g., rollers 706B, 710B) is aligned with each other, and 180 degrees out of phase with the adjacent rollers (e.g., 708B, 712B). The eccentric shape of the rollers provide a plurality of support elevations for the substrate 700 between a first support elevation, for example, the maximum elevation when the eccentricity is pointing upwards, and a second support elevation, for example, the minimum elevation when the eccentricity is pointing downwards. As the substrate 700 moves from left to right, the leading edge 702 will be raised by the roller 710B, thereby compensating for any downward deflection that may occur to the leading edge 702 in the unsupported region between roller 710B and 712B. As such, when the substrate 700 comes into contact with the roller 712B, the leading edge 702 will not forcibly come into contact with the roller 712B. The shape and amount of eccentricity of the roller 704B may be controlled to provide smooth transport of the substrate 700.

In addition, the position of the substrate 700 when initially placed on the rollers 704B may be controlled in conjunction with the relative rotational position of the rollers 704B, such that the leading edge 702 of the substrate 700 will always exit and extend from the high portion of a roller as it moves toward an adjacent roller, as shown in FIG. 7B. Alternatively, and as shown in FIG. 7C, the plurality of rollers 104 may comprise cylindrical rollers mounted on an offset axis 704C and disposed eccentrically in an alternating fashion to provide the same raising and lowering effect of the substrate 700, as described above with respect to FIG. 7B.

Figure 7D:
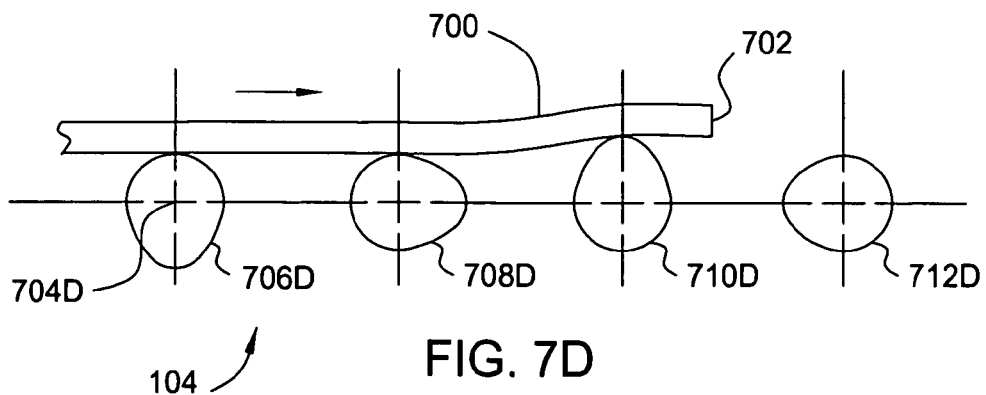
Figure 7E:
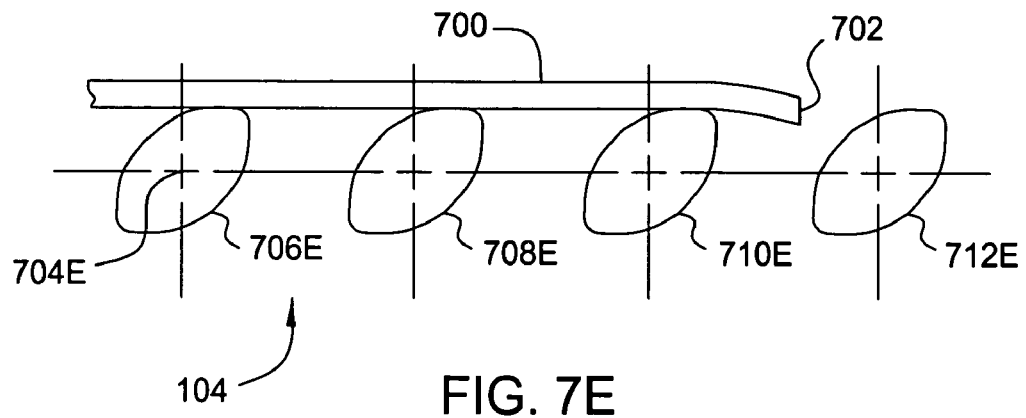

It is contemplated that other orientations of eccentric rollers may also be suitably utilized to prevent the leading edge of the substrate from contacting a subsequent roller as the substrate traverses the plurality of rollers. For example, FIG. 7D depicts a plurality of rollers 104 similar to those described with respect to FIG. 7B, above. However, in this embodiment, the eccentric rollers are sequentially out of phase with respect to each other by illustrative 90 degree increments in a counter-clockwise direction. A roller 706D is depicted with the eccentricity facing downwards. Each subsequent roller (rollers 708D, 710D, and 712D, respectively) have the eccentricity extending in a direction 90 degrees counter-clockwise from the previous roller.

The quantity of offset of the eccentricity of the rollers, i.e., rotational degrees out of phase, may be set to a desired angle depending on the spacing of the rollers, the amount of eccentricity of the rollers, and the amount of downward deflection of the substrate. It is contemplated that the quantity of degrees out of phase of the rollers is not limited to 180 and 90 degrees but may be any angle suitable to prevent the leading edge of the substrate from forcefully contacting a roller.

It is further contemplated that the shape of the eccentric roller is not limited to a single protrusion as depicted in FIGS. 7B and 7D. For example, a roller having any desired profile including single or multiple protrusions may be utilized to control the support elevations of a substrate supported thereon as the roller rotates. In one illustrative embodiment, the plurality of rollers 104 may comprise oval rollers 706E, 708E, 710E, 712E. The oval shape of the rollers may be used to control the support elevation of the substrate 700, and particularly of the leading edge 702 of the substrate, as the substrate traverses, for example, from a leading roller 710E to a subsequent roller 712E.

Figure 11:
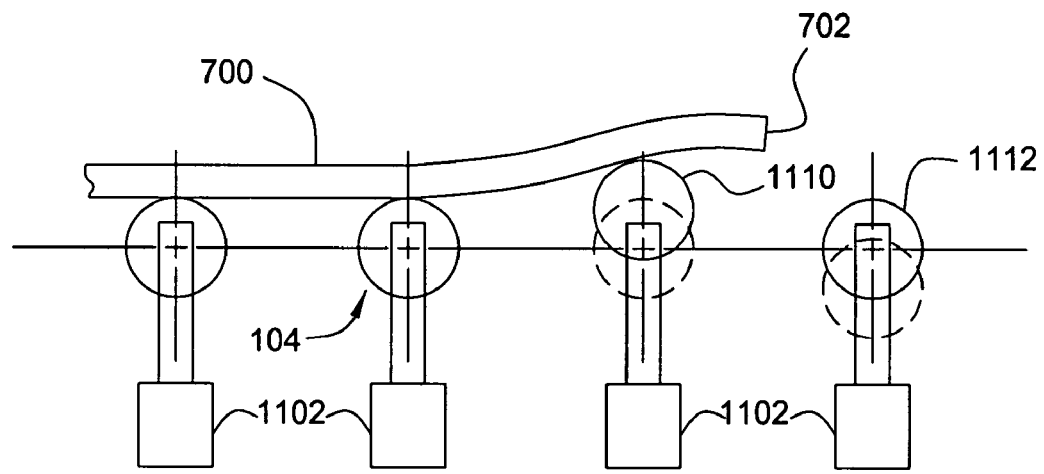
FIG. 11 is a partial schematic side view of one embodiment of the plurality of rollers.

It is further contemplated that other configurations of the plurality of rollers 104 may be utilized to compensate for any sagging of the leading edge of the substrate, such as configurations that control the height of the rollers or that provide a separate mechanism for supporting the leading edge of the substrate. For example, FIG. 11 depicts a partial schematic side view of one embodiment of the plurality of rollers 104. In one embodiment, each of the plurality of rollers 104 may be coupled to an actuator 1102. The actuators 1102 may be any suitable actuator or mechanism for controlling the support elevation of the plurality of rollers 104, such as pneumatic or hydraulic actuators, motors, screws, and the like. Each actuator 1102 may be individually controlled to selectively and dynamically adjust the position of any of the plurality of rollers 104 with respect to each other as the substrate traverses the plurality of rollers 104. For example, in the embodiment depicted in FIG. 11, the leading edge 702 of the substrate 704 is supported by a roller 1110 that is raised at least with respect to a subsequent roller 1112. Alternatively or in combination, the subsequent roller in the direction of travel, e.g., roller 1112, may be lowered, as shown in phantom, to further facilitate the smooth transition of the leading edge 702 to the roller 1112. Although described in FIGS. 7B-E and FIG. 11 as incorporated into a vacuum conveyor system, it is contemplated that the roller configurations described may be utilized in other conveying and processing systems where compensation for any sag of the leading edge of a substrate is desired.

Returning to FIG. 1A, a load lock 110 is coupled to the vacuum sleeve 102 at each of a first end 112 and a second end 114 of the vacuum sleeve 102. A pressure control system (not shown), including pumps, ports, valves, meters, and the like, may be coupled to the vacuum sleeve 102 to control the pressure within the vacuum sleeve 102 at a desired level. For example, the pressure in the vacuum sleeve 102 may be maintained at or near the pressure as is maintained within the process chambers to minimize changes in pressure upon transferring substrates between the vacuum sleeve 102 and the process chambers, thereby conserving the time required to re-adjust the chamber pressures to appropriate processing levels and further minimizing contamination of the process chamber by any particles that may be carried into the process chamber due to an increase in the chamber pressure.

A controller 150 is provided to facilitate control and integration of the vacuum conveyor system 100. The controller 150 typically comprises a central processing unit (CPU), memory, and support circuits (not shown). The controller 150 may be coupled to various components of the vacuum conveyor system 100 in order to control movement and/or processing of the substrate. For example, the controller 150 may control the plurality of rollers 104, the substrate handlers 106, the pressure control system, and the like. The controller 150 may be coupled to or may be the same as a controller provided to control other components such as any load locks and/or process chambers coupled to the vacuum conveyor system 100.

Figure 2:
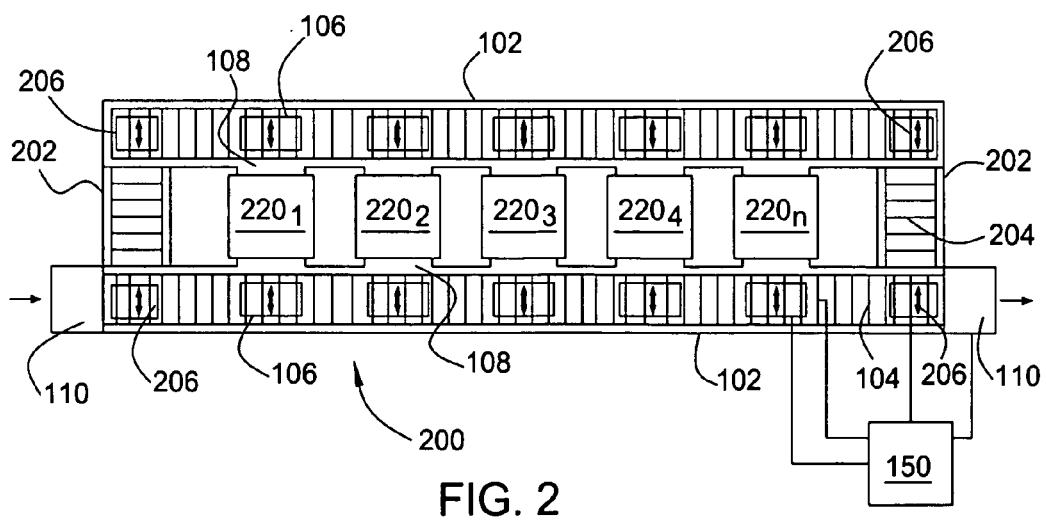
FIG. 2 is a top view of another embodiment of a vacuum conveyor system.

FIG. 2 discloses another embodiment of a vacuum conveyor system 200. The vacuum conveyor system 200 is similar to the vacuum conveyor system 100 described above with respect to FIG. 1A, except that the vacuum conveyor system 200 has two vacuum sleeves 102 running parallel to each other. The two vacuum sleeves 102 have one or more process chambers 220 disposed therebetween and sealably coupled to the vacuum sleeves 102 by respective connectors 116.

The vacuum conveyor system 200 having two vacuum sleeves 102 facilitates increased processing throughput. The two vacuum sleeves 102 also facilitate continued processing in the event of a failure of one of the vacuum sleeves. Optionally, the vacuum sleeves 102 may be selectively isolatable from each other, for example by a valve or other suitable mechanism, to allow continued processing through the operable vacuum sleeve without maintaining a vacuum in the inoperable vacuum sleeve. In addition, maintenance or inspection of the inoperable vacuum sleeve may be performed while continuing to process substrates through the operable vacuum sleeve.

The process chambers 220 utilized with the vacuum conveyor system 200 have a pass-through design, i.e., they have slit valves located on opposing sides of the process chamber 220, allowing a substrate to enter on one side of the process chamber 220 and exit on an opposite side of the process chamber 220. As such, substrate handlers 106 are provided on both sides of the process chamber 220 to facilitate moving the substrate into and out of the process chamber 220 at either end. In one embodiment, the substrate handlers 106 may be the substrate handler described herein with respect to FIGS. 3A-B. Alternatively, the substrate handlers 106 may comprise the nested substrate handlers as described with respect to FIGS. 4A-B.

A connector sleeve 202 is coupled between at least one end of the vacuum sleeves 102 to facilitate moving substrates from one vacuum sleeve 102 to the other without going through the process chambers 220. The connector sleeve 202 contains a plurality of rollers 204 to facilitate moving the substrate through the connector sleeve 202. The plurality of rollers 204 may be configured similarly to the plurality of rollers 104. In one embodiment, the plurality of rollers 204 are configured similar to the plurality of rollers described in FIGS. 6A-B.

In the embodiment depicted in FIG. 2, two connector sleeves 202 are coupled between the vacuum sleeves 102, one connector sleeve 202 at either end. Although any angle is contemplated, the connector sleeves 202 are substantially perpendicularly coupled to the vacuum sleeves 102 for ease of fabrication and operation. A substrate handler 206 is provided at least at one of the interfaces between vacuum sleeves 102 and connector sleeves 202 to facilitate moving the substrate between the rollers 104 in the vacuum sleeves 102 and the rollers 204 in the connector sleeve 202. In the embodiment depicted in FIG. 2, one substrate handler 206 is provided at each interface between vacuum sleeves 102 and connector sleeves 202, e.g., at each corner of the vacuum conveyor system 200.

Figure 8:
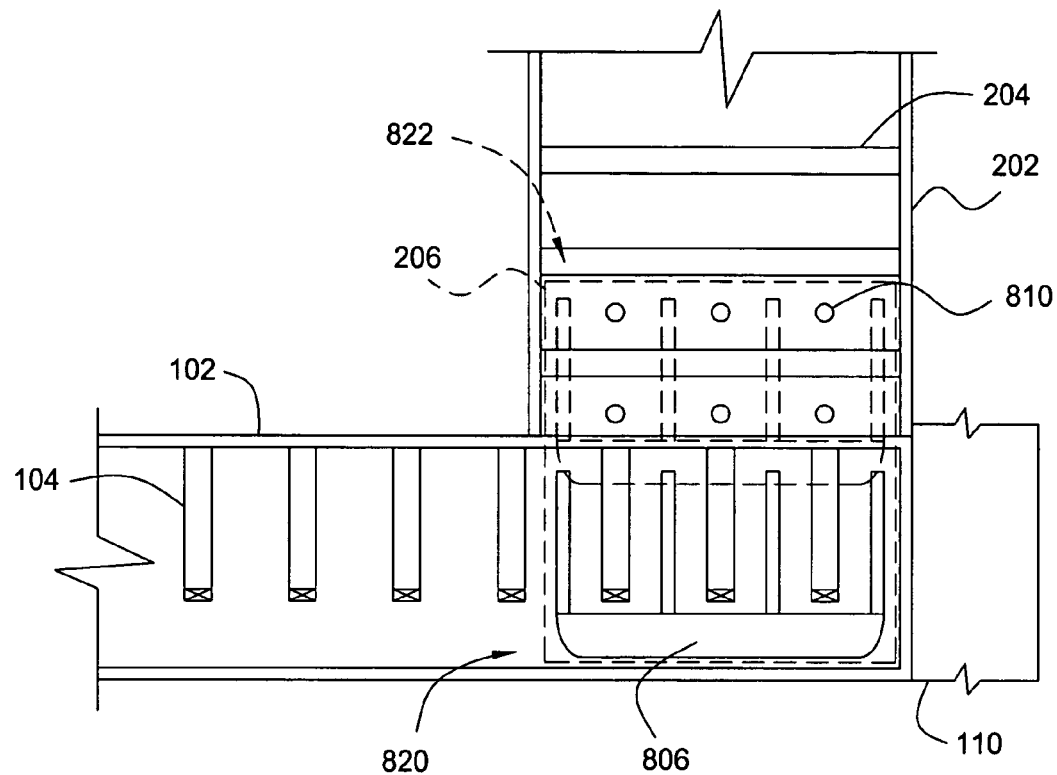
FIG. 8 is a top view of another embodiment of a substrate handler.

FIG. 8 depicts one embodiment of a substrate handler 206 for transferring substrates between the plurality of rollers 104 contained in the vacuum sleeve 102 and the plurality of rollers 204 contained in the connector sleeve 202, as shown in the corners of the vacuum conveying system 200 depicted in FIG. 2. In one embodiment, a substrate handler 806 is configured and positioned in the vacuum sleeve 102 similar to substrate handler 106 described with respect to FIGS. 3A and 3B. However, instead of extending and retracting the substrate into the process chamber, the substrate handler 806 extends and retracts to transfer the substrate onto a plurality of lift pins 810 provided between the plurality of rollers 204 of the connector sleeve 202.

In operation, as the substrate passes over the substrate handler 806 while in retracted position 820, the substrate handler 806 may rise up to lift the substrate off of the plurality of rollers 104 and move to an extended position 822 disposed over the plurality of rollers 204 and lift pins 810. From the extended position 822, the substrate handler 806 may then lower the substrate onto lift pins 810 and proceed back to the retracted position 820. Alternatively, the lift pins may be configured to extend to a height that facilitates lifting the substrate off of the substrate handler 806, which may then proceed to the retracted position 820. The lift pins 810 may then lower the substrate onto the plurality of rollers 204, which then move the substrate to the next desired destination.

Referring to FIGS. 1 and 2, the vacuum conveyor system disclosed herein is scalable and may be coupled to as few or as many process chambers as required for particular processing requirements. For example, the length of the vacuum sleeves 102 and the number of ports 108 provided may be tailored for a particular application. In addition, the vacuum conveyor system may be segmented to facilitate scalability. For example, a segment could be the width of a single process chamber. Multiple segments may be sealably coupled together as desired to form a vacuum conveying system of the desired length to service the desired number of process chambers.

Alternatively, where known numbers of process chambers are used in combination to perform standard processes on substrates, the segments may be larger in order to reduce the number of components, the amount of work needed to seal the chambers together, and the likelihood of leaks, thereby making the vacuum conveyor system more simple and robust. For example, in applications where a cluster of five CVD chambers are typically provided to perform processing of a substrate, a segment of the vacuum conveying system vacuum sleeve 102 may be five process chambers in width, rather than piecing together five single-chamber width segments.

Furthermore, the vacuum conveyor system may be modular to separate sections utilizing different processes or operating at different pressures. For example, a first module may comprise a first group of process chambers and a second module may comprise a second group of process chambers. The first group and the second group of process chambers may be running processes having different operating pressures. For example, the first group of process chambers may comprise CVD chambers and the second group of chambers may comprise PVD chambers. The two modules may be independently configured as any of the embodiments of vacuum conveyor systems described herein and may be coupled via a load lock to allow transfer between modules without exposing either the substrate or the vacuum conveyor system modules to atmospheric pressure.

Figure 9:
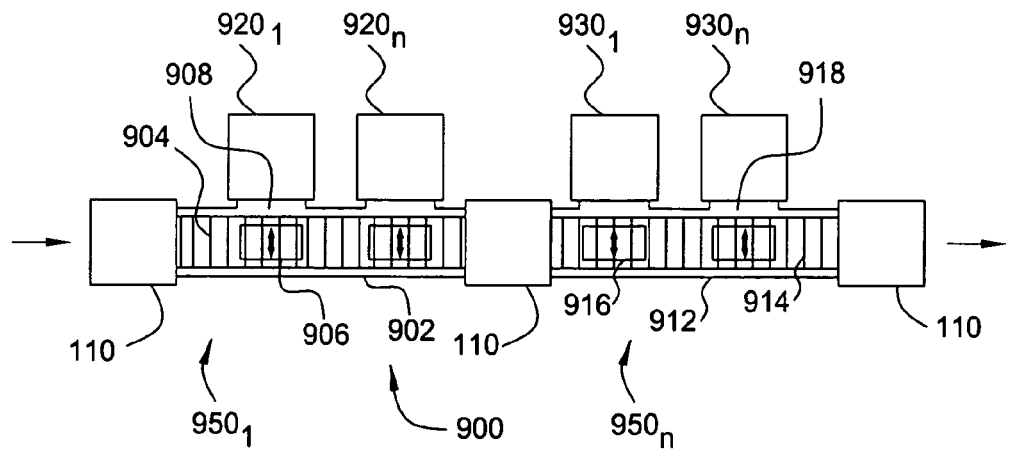
FIG. 9 is a schematic top view of another embodiment of a vacuum conveyor system.

For example, FIG. 9 depicts a vacuum conveying system 900 having a first vacuum conveying module $950_1$ coupled to a second vacuum conveying module $950n$ by a load lock chamber 110. Additional load lock chambers 110 are provided at either end of the first and second vacuum conveying modules $950_1$ and $950_n$ to provide entrance to and egress from the vacuum conveying system 900. The first vacuum conveying module $950_1$ comprises a vacuum sleeve 902 having rollers 904 and substrate handlers 906 contained therein. A connector 908 is provided to interface with one or more process chambers $920_1$ through $920n$. A dedicated substrate handler 906 is provided for each process chamber. The second vacuum conveyor module $950_n$ similarly comprises a vacuum sleeve 912 having rollers 914 and substrate handlers 916 disposed therein, and interfaces with one or more process chambers $930_1$ through $930_n$. A dedicated substrate handler 916 is provided for each process chamber $930_n$. The vacuum sleeves, plurality of rollers, and substrate handlers may comprise any of the embodiments described herein and further include all other components required to operate the vacuum conveyor system, such as the vacuum pumps, controllers, and the like.

As the first and the second vacuum conveyor modules $950_1$ and $950_n$ are sealed from each other via load lock 110, they may be held at different levels of vacuum. For example, where process chambers $920_1$ through $920_n$ are running a process utilizing a different level of vacuum than process chambers $930_1$ and $930_n$, the first and second vacuum conveyor modules $950_1$ and $950_n$ may be held at respective vacuum levels correlating to the vacuum level of the particular process chambers connected to that vacuum conveyor module. For example, CVD processes generally operate at a higher pressure than PVD processes. As such, the process chambers $920_1$ through $920_n$ may be a cluster of CVD chambers separated by the load lock 110 from the process chambers $930_1$ through $930_n$, which may be a cluster of PVD process chambers. In this example, the pressure maintained in the vacuum conveyor module $950_1$ may be substantially equal to the pressure maintained in the CVD process chambers $920_1$ through $920_n$, while the pressure maintained in the vacuum conveyor module $950_n$ may be substantially equal to the lower pressure maintained in the PVD process chambers $930_1$ through $930_n$.

Figure 10:
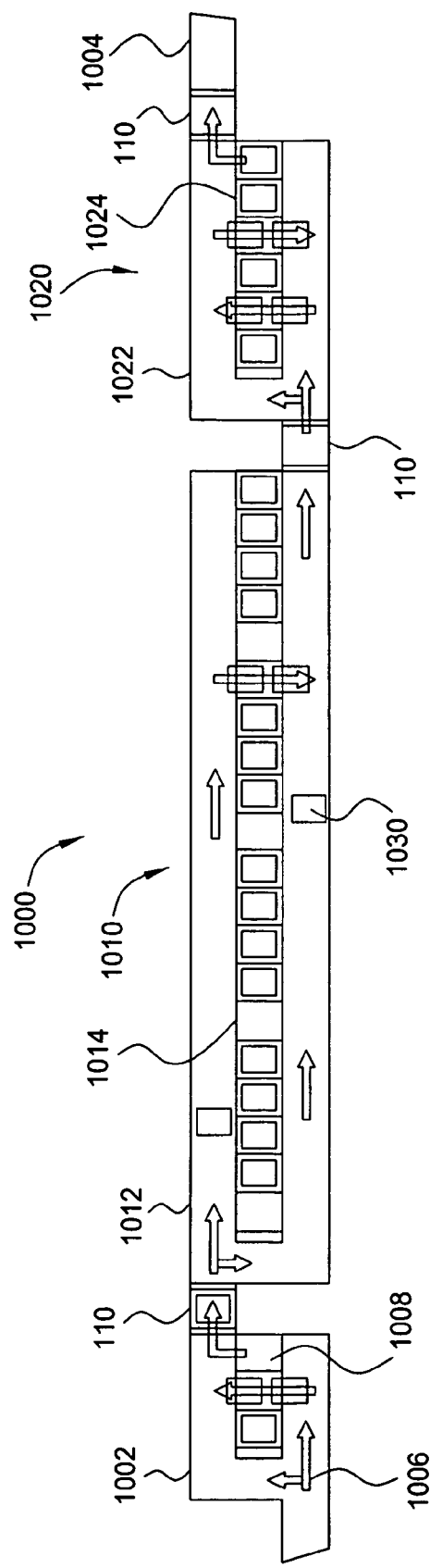
FIG. 10 is a schematic top view of another embodiment of a vacuum conveyor system.

FIG. 10 depicts one specific embodiment of a system of a hybrid CVD/PVD processing system 1000. The system 1000 generally comprises a first vacuum conveyor module 1010 coupled to a second vacuum conveyor module 1020 through a load lock 110. Additional load locks 110 are provided at the opposing ends of the vacuum conveyor modules 1010 and 1020 to provide entrance to and egress from the vacuum conveyor modules 1020 and 1020. In the embodiment depicted in FIG. 10, an atmospheric conveyor 1002 is coupled to the first module 1010 via the load lock 110. The atmospheric conveyor 1002 allows coupling to processing chambers that do not operate at a vacuum. For example, in one embodiment, a plurality of process chambers 1008 are coupled to the atmospheric conveyor 1002 for processing substrates prior to entering the vacuum conveyor system 1000. Process chambers 1008 may be, for example, pre-deposition cleaning chambers. In one embodiment, the pre-deposition cleaning chambers each run a sixty-second process having an eight-second transfer time, yielding a sixty-eight second total actual cycle time (TACT). The sixty-eight second TACT corresponds to the fifty-two substrates per hour handled by each process chamber 1008. In the embodiment depicted in FIG. 10, three pre-deposition cleaning chambers 1008 are provided and may run in parallel to provide a total substrate throughput of 156 substrates per hour.

As each substrate is finished being processed, it is transferred through the load lock 110 to the first vacuum conveyor module 1010, which is held at a first vacuum pressure. The first vacuum conveyor module 1010 comprises a vacuum conveyor 1012 and a plurality of process chambers 1014. The vacuum conveyor 1012 is similar to the vacuum conveyor systems described in the various embodiments detailed above. In the embodiment depicted in FIG. 10, twenty process chambers 1014 are disposed within the first vacuum conveyor module 1010. In one embodiment, the process chambers 1014 are CVD process chambers. The CVD chambers may be configured to perform various processes, such as depositing a gate silicone nitride layer, amorphous silicone layer, and a doped silicone layer. These processes each may be performed in the same or different process chamber 1014, at a throughput of six substrates per hour per chamber. Multiplied by twenty chambers, the total throughput for the first vacuum conveyor module 1010 equals 120 substrates per hour.

Once the substrates are finished being processed within the first vacuum conveyor module 1010, they proceed through the vacuum conveyor 1012 to load lock 110 and into the second vacuum conveyor module 1020. The second vacuum conveyor module 1020 comprises a vacuum conveyor 1022, as previously described, and a plurality of process chambers 1024. In one embodiment, six process chambers 1024 are provided. The process chambers 1024 in the second module may be PVD chambers, which operate at a higher vacuum level than the CVD chambers of the first module. As such, the vacuum conveyor 1022 of the second vacuum conveyor module 1020 is maintained at a higher level of vacuum than the vacuum conveyor 1012 of the first vacuum conveyor module 1010.

The PVD chambers 1024 may be arranged to perform various vacuum processes on the substrate. In one embodiment, two of the process chambers 1024 are configured to deposit a layer of molybdenum on the substrate. For example, a 1,000-angstrom thick layer of molybdenum may be deposited on the substrate at a rate of approximately 2,500 angstroms per minute. Such a process generally has a twenty-four second process time, ten seconds of overhead, and an eight second transfer time, yielding a 42 second TACT. The 42 second TACT corresponds to 85 substrates per hour in each chamber, yielding a total substrate throughput for the two chambers of 170 substrates per hour.

Three of the process chambers 1024 may be configured to deposit a layer of aluminum or other metal on the substrate. For example, a 3,000-angstrom layer of aluminum may be deposited on the substrate at a rate of approximately 3,000 angstroms per minute. Such a process generally has a sixty second process time, ten seconds of overhead, and an eight second transfer time, yielding a total of 78 second TACT. The 78 second TACT corresponds to 48 substrates per hour per chamber, which for three chambers yields a total throughput of 138 substrates per hour.

Finally, a process chamber 1024 may be configured to deposit a layer of molybdenum on the substrate. For example, a 500-angstrom layer of molybdenum may be deposited on the substrate at a rate of approximately 2,500 angstroms per minute. Such a process generally has a twelve second process time, ten seconds of overhead, and an eight second transfer time, which yields a TACT of 30 seconds. The 30-second TACT corresponds to a throughput of about 120 substrates per hour.

Upon completion of processing of PVD processes in the second vacuum conveyor module 1020, process substrate exits the module 1020 through load lock 110 to an atmospheric conveyor 1004, where the substrate is moved for continued processing. As the total processing throughput depends upon the slowest processing times, the hybrid CVD/PVD processing system 1000 described above has a total throughput of about 120 substrates per hour.

Thus embodiments, of a vacuum conveyor system have been provided. The vacuum conveyor system may utilize conventional vacuum processing chambers and is scalable, segmented, and/or modular. The vacuum conveyor system has a small volume that is easier to maintain at vacuum pressures and contains dedicated substrate handlers for each process chamber. Modular vacuum conveyor systems may be coupled by load locks and independently maintained at vacuum pressures corresponding to the process chambers attached to the respective module. The vacuum conveyor system contains a roller drive system that controls the movement of substrates through the system. The roller drive system may be configured to compensate for sagging of the leading edge of the substrate in unsupported areas between rollers.

Although the above embodiments mainly refer to linear vacuum conveyor systems, it is contemplated that the vacuum conveyor systems may be parallel with offset axes or linked together non-linearly. For example, the vacuum conveyor system or modules may connect perpendicularly, or be linked together by a vacuum sleeve that provides another angle of alignment, including a "U" shaped configurations. Furthermore, although the above embodiments have been described mainly with respect to glass substrates, it is contemplated that the vacuum conveyor system disclosed herein may be useful for transporting and processing other substrates, for example polymer substrates or semiconductor substrates, that undergo serial vacuum processing.

While the foregoing is directed to embodiments of the present invention, other and further embodiments of the invention may be devised without departing from the basic scope thereof, and the scope thereof is determined by the claims that follow.

The invention claimed is:

1. A method of processing substrates, comprising:
(a) providing a first substrate into a vacuum conveyor system having a first vacuum sleeve having a port for sealably coupling the first vacuum sleeve to a first process chamber, a plurality of substrate supports that support and move substrates through the first vacuum sleeve, and a first substrate handler disposed within the first vacuum sleeve proximate the port;
(b) conveying the first substrate through the first vacuum sleeve to a position above the first substrate handler;
(c) vertically actuating the first substrate handler to lift the first substrate from the plurality of substrate supports; and
(d) horizontally actuating the first substrate handler to move the first substrate through the port and into the first process chamber.

2. The method of claim 1, further comprising:
(e) placing the first substrate on a substrate support disposed in the first process chamber coupled to the first vacuum sleeve.

3. The method of claim 1, further comprising:
(e) picking up a second substrate disposed on a substrate support in the first process chamber coupled to the first vacuum sleeve with a second substrate handler;
(f) retracting the second substrate handler to place the second substrate on the plurality of substrate supports; and
(g) placing the first substrate on the substrate support and retracting the first substrate handler.

4. A method of processing substrates, comprising:
(a) providing a first substrate into a vacuum conveyor system having a first vacuum conveyor sleeve having a port for sealably coupling the first vacuum sleeve to a process chamber, a plurality of substrate supports that support and move substrates through the first vacuum sleeve, and a first substrate handler disposed within the first vacuum sleeve proximate the port, wherein the vacuum conveyor system has a second vacuum sleeve having a port for sealably coupling the second vacuum sleeve to the process chamber, a plurality of substrate supports that support and move substrates through the second vacuum sleeve, and a second substrate handler disposed within the second vacuum sleeve proximate the port, wherein the first and second vacuum sleeves are disposed in parallel and are coupled to opposing access ports of the process chamber;
(b) conveying the first substrate through the first vacuum sleeve to a position above the first substrate handler;
(c) vertically actuating the first substrate handler to lift the first substrate from the plurality of substrate supports disposed in the first vacuum sleeve;
(d) picking up a second substrate disposed on a substrate support in the process chamber with the second substrate handler;
(e) retracting the second substrate handler to place the second substrate on the plurality of rollers disposed in the second vacuum sleeve; and
(f) placing the first substrate on the substrate support and retracting the first substrate handler.

5. A method of processing substrates, comprising:
(a) providing a substrate into a vacuum conveyor system having a vacuum conveyor sleeve having a port for sealably coupling the vacuum sleeve to a process chamber, a plurality of substrate supports that support and move substrates through the vacuum sleeve, and a substrate handler disposed within the vacuum sleeve proximate the port;
(b) conveying the substrate through the vacuum sleeve to a position above the substrate handler;
(c) vertically actuating the substrate handler to lift the substrate from the plurality of substrate supports; and
(d) horizontally actuating the substrate handler to move the substrate over a plurality of lift pins disposed in a connector sleeve coupled to the vacuum sleeve.

6. The method of claim 1, further comprising:
(e) transferring the first substrate from the first process chamber through a load lock chamber into a second vacuum conveyor sleeve, wherein the second vacuum conveyor sleeve is at a vacuum level different than that of the first conveyor sleeve.

7. The method of claim 6 further comprising:
(f) transferring the first substrate disposed in the second vacuum conveyor sleeve to a second deposition chamber coupled to the second vacuum conveyor sleeve.

* * * * *

UNITED STATES PATENT AND TRADEMARK OFFICE
CERTIFICATE OF CORRECTION

PATENT NO. : 7,438,175 B2  Page 1 of 1
APPLICATION NO. : 11/176085
DATED : October 21, 2008
INVENTOR(S) : White et al.

It is certified that error appears in the above-identified patent and that said Letters Patent is hereby corrected as shown below:

Column 5, Line 41, please delete "$12O_n$" and insert --$120_n$-- therefor;

Column 6, Lines 16-18, please delete "The tube 316 provides a sealed area long enough to allow the extension 314 to move as required to control the horizontal position of the substrate handler 106."

Column 14, Line 25, please delete "handier" and insert --handler-- therefor.

Signed and Sealed this

Seventeenth Day of February, 2009

JOHN DOLL
*Acting Director of the United States Patent and Trademark Office*